March 3, 1959 R. E. SWANSON ET AL 2,875,506

METHOD OF ELECTROFORMING TRANSISTORS

Filed Dec. 9, 1955 2 Sheets-Sheet 1

INVENTORS
ROBERT E. SWANSON
ARVID W. BERGER

BY Harry T. Berriman
AGENT

INVENTORS
ROBERT E. SWANSON
ARVID W. BERGER
BY Harry T. Berriman
AGENT

United States Patent Office 2,875,506

Patented Mar. 3, 1959

2,875,506

METHOD OF ELECTROFORMING TRANSISTORS

Robert E. Swanson, Poughkeepsie, and Arvid W. Berger, Hyde Park, N. Y., assignors to International Business Machines Corporation, New York, N. Y., a corporation of New York Application December 9, 1955, Serial No. 552,071

11 Claims. (Cl. 29—25.3)

This invention relates to semi-conductor devices and more particularly to a method of electrically treating such devices so as to establish the electrical characteristics thereof within desired limits.

It is recognized in the transistor art that the current gain or amplification factor of transistors of the point contact collector type may be enhanced by so-called electroforming operations. These operations usually comprise applying direct current surges between two or more selected electrodes of the transistor, the transistor electrodes being defined as the collector, emitter and base elecrodes. Although the accepted electroforming procedures do permit the amplification factor or alpha of transistors to be increased, the electroforming operations also lower the collector electrode reverse or back resistance of some of the treated transistors to such an extent that they cannot be utilized in various circuit applications.

The subject electroforming method not only increases the current gain of manufactured transistors to desired values, but also permits the back resistance thereof to be accurately established within desired limits.

The principal object of the present invention is therefore to provide improved transistors of uniform characteristics. This object is achieved by means of a particular electroforming process. The electroforming process comprises, first establishing the transistor amplification factor or alpha by passing direct current surges or impulses of controlled time duration and peak voltage between the collector electrode and the emitter electrode, with the base electrode being left unconnected. After the application of each forming impulse, the transistor is operated in a testing circuit including a cathode ray tube to determine if the amplification factor or the current-voltage characteristic curve of the emitter collector path is within a desired standard. If not the forming current impulse is again applied. If after repeated application of the forming impulses of a first predetermined peak voltage, the amplification factor is not at a desired value, the peak voltage of the forming impulses is increased. If the desired amplification factor is still not obtained, the peak voltage of the forming impulses is increased again and the sequence repeated. This procedure is followed until the desired amplification factor is finally established.

As a subsequent step in the process, direct current forming surges or impulses of longer time duration than that used to establish the desired amplification factor are applied between the collector and emitter electrodes to increase the collector to emitter reverse or back resistance to a desired value. The peak voltage of these latter impulses may also be increased by degrees to give the desired result. After the application of each of the latter forming impulses, the transistor is operated within a testing circuit to determine if the reverse resistance is within a desired value. If after repeated application of the latter forming impulses, the back resistance is not within the desired limits, the duration of the forming impulses is increased with the peak voltage thereof being also varied from an initial value to increased values as before. Still further increases in the duration of the forming impulses may be effected, if required, until the desired back resistance is achieved, however, in all instances, the forming impulse or impulses utilized to increase the collector back resistances are of longer duration than the forming impulse or impulses initially applied to establish the amplification factor at the desired value. The original shorter pulses may be used to lower the back resistance without appreciably changing alpha in the event the longer impulses raise the back resistance higher than a desired limit.

Similar results may be achieved if the initial forming impulses for establishing the amplification factor, and the subsequent forming impulses for establishing the back resistance, are applied between the collector and base with the emitter being left unconnected.

Other objects of the invention will be pointed out in the following description and claims and illustrated in the accompanying drawings, which disclose, by way of example, the principle of the invention and the best mode, which has been contemplated, of applying that principle.

Figure 1:
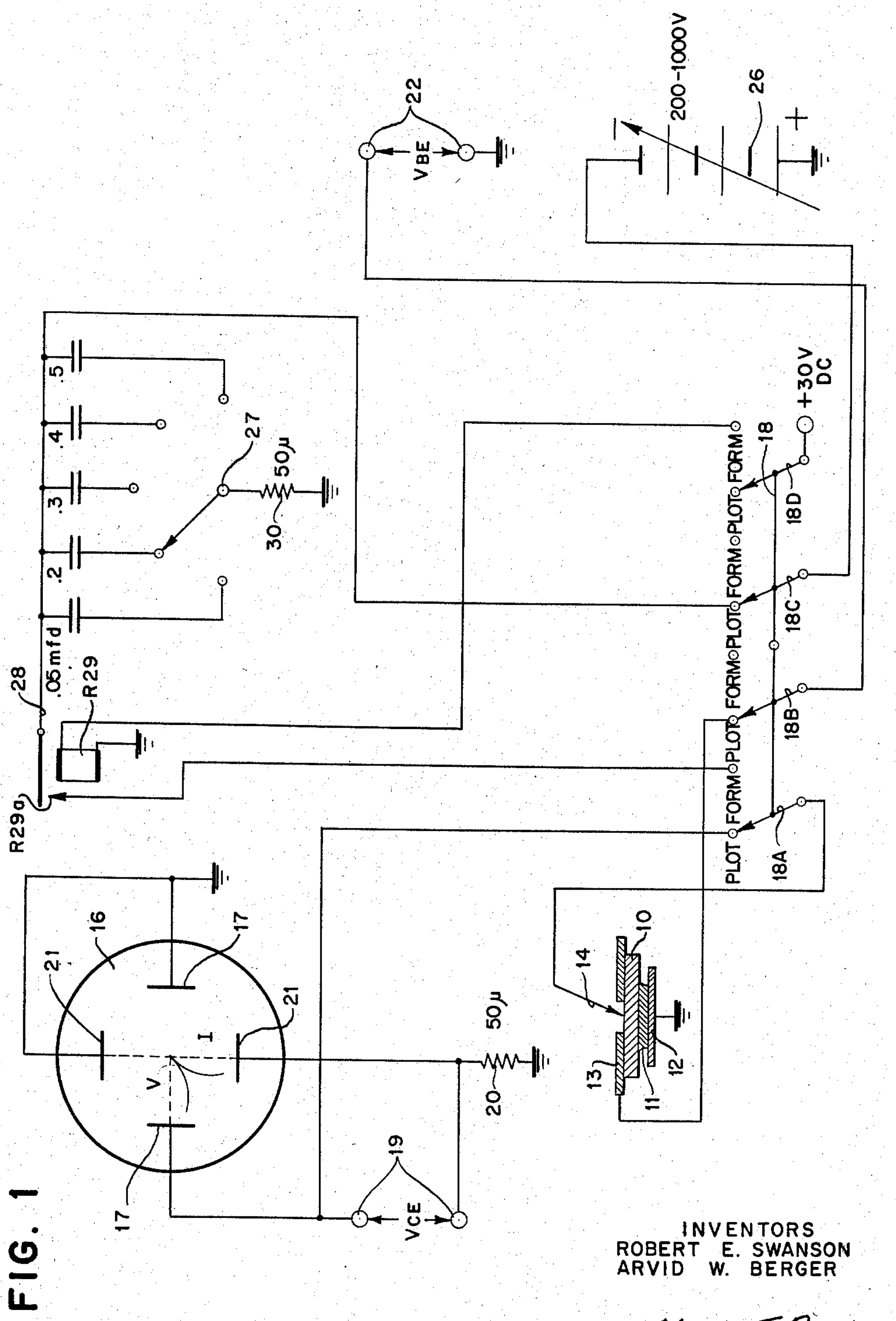
Fig. 1 shows the electroforming and testing circuit.

In the forming circuit, Fig. 1, a representative transistor is shown in section and comprises a disc or plate 10 of N type germanium of a resistivity of between 5 of 10 ohm centimeters and minority carrier lifetime, greater than 50 microseconds. A dot of indium 11 is heat fused into the one surface of the germanium with a quantity of the indium protruding from the surface of the germanium. A copper emitter element 12 is soldered to the indium 11 and spaced from the germanium by the indium. A base electrode 13 of nickel is soldered to the other surface of the germanium, and a collector electrode 14 having a chisel point, is maintained in engagement with the surface of the germanium through a suitable opening in the base electrode 13. The collector electrode 14 is formed of a material known as Phosphor bronze (trademark), the phosphor constituent being a so-called "donor" type of impurity.

The transistor shown in Fig. 1 is of the special type defined as "thyratron" transistors. This type of transistor like a thyratron can be triggered by a suitable input signal into an On state of heavy current conduction. These transistors like thyratrons do not turn Off upon termination of the input signal, but must be turned Off by some other means.

Referring to Fig. 1, the testing device for the thyratron transistor to be electroformed comprises a cathode ray tube 16 of conventional type, only the deflection plates of which are shown. The one horizontal deflection plate 17 is connected through a switch element 18*a* of a 4 pole-double throw, manual switch 18, to the collector electrode 14, when the switch 18 is in a so-called plot position, as indicated. The other horizontal deflection plate 17 is connected through the common circuit ground to the emitter electrode 12. It will also be noted that the collector electrode 14, when the switch element 18A of the 4 pole switch 18 is in the "plot" position indicated, is connected to terminal 19 on which a voltage defined as $V_{CE}$ (voltage between collector and emitter) is impressed from a suitable source, the one terminal 19 being linked through a 50 ohm load resistor 20, and the common ground, to the emitter electrode 12. The vertical deflection plates 21 are connected across the load resistor 20, as indicated. It is thus evident that the horizontal deflection of the cathode ray beam will be proportional to the voltage $V_{CE}$ applied between the emitter and collector electrodes 12 and 14, and the vertical deflection will be proportional to the current which passes between the two electrodes 12 and 14.

The base electrode 13 of the transistor when the switch 18 is in the so-called "plot" position, is connected through a switch element 18B, to terminal 22 on which a voltage defined as $V_{BE}$ (voltage base to emitter) is impressed from a suitable source. The one terminal 22 is linked through the common circuit ground to the emitter electrode 12.

Figures 2, 3:
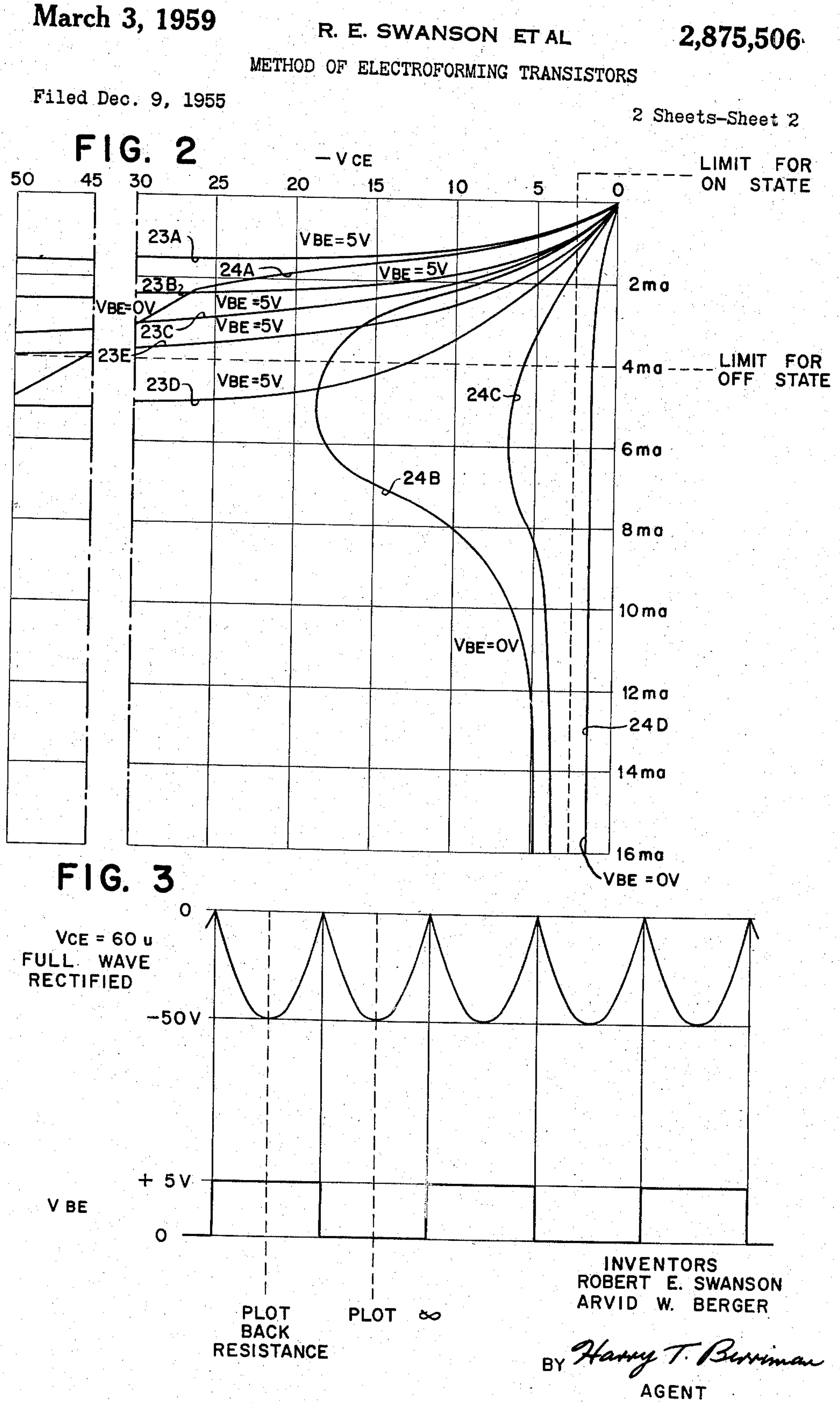
Fig. 2 shows the transistor characteristics obtained on the cathode ray tube used in the testing circuit.
Fig. 3 shows the waveform of the voltages applied to the transistor in order to generate the characteristics as shown in Fig. 2.

Referring now to Fig. 3 there is shown the waveform of the two voltages $V_{CE}$ and $V_{BE}$. The voltage $V_{CE}$ is obtained by a full wave rectification of 60 cycle A. C. to form pulsating D. C. of 120 pulsations per second, the voltage swinging between 0 volt and a peak voltage of minus 50 volts. The voltage $V_{BE}$ is generated by a square wave generator and has minimum of 0 volt and a maximum of plus 5 volts, there being 60 pulses per second. The voltages $V_{CE}$ and $V_{BE}$ are synchronized as indicated so that during one pulsation of $V_{CE}$, $V_{BE}$ is at +5 volts, and during the next pulsation of $V_{CE}$, $V_{BE}$ is at 0 volt, and so forth.

With the 4 pole switch 18 in the "plot" position so that $V_{BE}$ is applied between the base electrode 13 and emitter electrode 12, and $V_{CE}$ is applied between the collector electrode 14 and the emitter electrode 12, the transistor characteristics are plotted on the cathode ray tube 16 by the following action. During the period when $V_{BE}$ is at +5 volts, the emitter electrode 12 is negative with respect to the base electrode 13 so that the collector electrode current is at a minimum or the transistor may be considered as being in an Off state. Under these circumstances, a curve such as 23A (see Fig. 3) is plotted on the face of the tube 16, this curve 23A being representative of the back resistance between the collector and emitter electrodes.

During the period when $V_{BE}$ is at 0 volt, with the emitter electrode 12 positive with respect to the base electrode 13, the swing of the associated waveform $V_{CE}$, effects a heavy collector electrode current flow or the transistor may be considered as being in an On state. Under these circumstances a curve such as 24A (see Fig. 3) is plotted on the face of the cathode ray tube 16, the curve 24A being representative of the collector electrode output characteristic. After the transistor is On, the emitter electrode 12 in effect loses control so that it is the decrease of $V_{CE}$ toward zero that finally transfers the transistor from its On to Off state. As long as the switch 18 remains in the "plot" position, each cycle of the voltage $V_{BE}$ causes an alternate plotting of the back resistance and the output characteristic and by reason of the persistence of the screen of the tube 16, the two curves 23A and 24A appear simultaneously thereon. The two curves 23A and 24A are representative of the back resistance and output characteristic, respectively, of the transistor prior to the actual forming operation.

Referring again to Fig. 1, the actual forming circuit comprises a source of D. C. potential 26 which may be varied between 200 and 1000 volts. The positive side of the source 26 is grounded and the negative terminal is connected to the transfer member of a switch element 18C of the switch 18. When the switch 18 is in the "plot" position, the circuit from the supply 26 extends through the switch element 18C to the one side of 5 separate capacitors of .05, .2, .3, .4, and .5 microfarad capacity, respectively. The other side of each of the 5 capacitors is connected to a related switch point of a 5 position rotary selector switch 27. The common wiper of the switch 27 is linked through a resistor 28 to ground. It is thus evident that with switch 18 in the plot position, one of the 5 capacitors, as selected by switch 27, is changed through resistor 28 to the potential setting of the supply 26. Resistor 28 is indicated in Fig. 1 as having a resistance of 50 ohms, its value is not critical however and may be anywhere in the range from 5 to 1000 ohms.

The common side of the 5 capacitors, is also linked through a conductor 28 to normally open mercury wetted contacts R29*a* of a relay R29. The contacts R29*a* are closed upon an energization of the relay R29 through a circuit extending from a plus 30 v. D. C. source and through a 4th element 18D of the switch 18, when the switch 18 is in the "plot" position. The switch elements of the switch 18 are mechanically adjusted so that they transfer in the following manner. Upon a manual transferring of switch 18 from the "plot" to the "form" position, the element 18C breaks first to disconnect the source 26 from the particular capacitor selected for charging as determined by the position of the switch 27. At the same time, the plot position of the switch element 18B breaks to disconnect the source of $V_{BE}$ from the transistor. Subsequently thereto, the form side of the switch element 18A closes to link the collector electrode 14 to the contacts R29*a*, still open. Thereafter, the form position of the switch element 18D closes to energize relay 29 and close contacts R29*a*. With the contacts R29*a* completed, a discharge path is completed from the particular capacitor previously changed during the "plot" operation, through conductor 28, the switch element 18A, the collector electrode 14, the transistor body portion, the emitter electrode 12, the common circuit ground, the resistor 28, and the selector switch 27 to the other side of the selected capacitor. The capacitor discharge through the transistor alters the electrical characteristics thereof in a manner as will be explained hereinafter in reference to the subject inventive method. The mercury wetted contacts R29*a* are utilized as the means to complete the capacitor discharge path to the transistor, to insure that there is no interruption in the discharge current through contact "bounce," as might be the case if the switch element 18A was the final circuit completing element.

As mentioned previously, the back resistance and collector output characteristic of the transistor prior to forming may appear, respectively, as indicated by curves 23A and 24A on the tube 16. As an initial step in the forming operation, the selector switch 27 is rotated to link the .05 microfarad condenser to the source 26, which is initially adjusted to its lowest or 200 v. potential. The switch 18 is then manually positioned in its form position and the charged .05 microfarad capacitor accordingly discharged through the transistor in the manner described. The switch 18 is then operated to its plot position in order that the results of the forming operation may be visually determined and at the same time, the .05 microfarad capacitor recharged. As a result of the initial forming operation, the output characteristic may now be as represented by the curve 24B, while the back resistance may be as represented by the curve 23B. The forming process is again effected by an operation of the switch 18 from the plot to the form position. The switch 18 is then reoperated to the plot position and the transistor characteristics may then be observed to be as represented by the curves 24C and 23C. This form and plotting operation is repeated until a desired output characteristic of high collector current at a particular voltage $V_{CE}$ is obtained. Thus for the representative transistor shown in Fig. 1 a substantially straight line collector current characteristic within a maximum of 2.5 volts $V_{CE}$ is desired, and such a characteristic when obtained would give a curve on tube 16 as indicated by curve 24D in Fig. 2. If it is not possible to achieve the desired collector output characteristic with a setting of 200 volts of the supply 26 for charging the capacitor, the supply potential 26 is increased and one or more discharges again applied to the transistor. If the desired characteristic is still not obtained, the supply potential is increased further by degrees up to a maximum of 1000 volts and the forming process repeated at each voltage setting until the desired collector output characteristic is finally obtained. Although the capacitance of the capacitor utilized to supply the forming impulse for increasing the current gain is shown as .05 microfarad, any capacitance in the range from .02 to .1 microfarad will give suitable results.

When the transistor has been formed so that the collector output characteristic is within the desired limit, the corresponding plot of the back resistance may indicate that the collector to base reverse resistance has been decreased so that more than a desired maximum of 4 milliamperes, for example, flows when the transistor is in the Off state. This condition would be represented by a plot on the tube 16 such as represented by the curve 23D in Fig. 2.

To establish the back resistance within the desired limit and yet maintain the output characteristic within the previously established limit therefor, the selector switch is switched to the .2 microfarad capacitor to give a longer duration discharge, whereafter the sequence of "form"—"plot" is effected, as previously described, until a desired plot such as 23E of the back resistance is obtained, with the corresponding output characteristic as represented by curve 24D still being within the desired limit. In the forming operation to reestablish the back resistance within desired limits, the potential of the source may be increased by degrees from 200 to 1000 volts as required, with a number of forming impulses being applied for each voltage setting. If it is impossible to establish the back resistance at the desired value by discharges from the .2 microfarad capacitor, a longer duration discharge is utilized for forming by selecting the .3 microfarad, and then, if necessary, selecting the .4 microfarad or .5 microfarad capacitor as the forming current source. Although .5 microfarad is indicated in Fig. 1 as the maximum capacity utilized in the second step of the forming, capacitors within the range from .2 microfarad to 1.0 microfarad will give suitable results.

In summary, the improved forming method comprises first, applying capacitor discharges of a controllable peak between the collector and emitter electrodes of the transistor to establish the collector output characteristic in current amplification factor within the desired limit, whereafter, longer duration capacitor discharges, also of controllable peak voltage, are applied between the collector and emitter electrodes to establish the back resistance within desired limits, without appreciably altering the output characteristic obtained as a result of the initial forming sequence with the shorter duration discharges.

It will be appreciated that the forming method need not be performed with capacitor discharge apparatus as shown, but could be effected by any suitable apparatus capable of generating suitable duration unidirectional currents of controllable peak voltage for the initial forming sequence, and longer duration unidirectional currents of controllable peak voltage for the final forming sequence. For example, the forming current could be provided by a saw tooth wave generator. It will also be appreciated that although the forming method is shown as applied to a so-called "thyratron" type transistor, the method may be utilized to achieve desired operating characteristics of any point contact collector type transistor.

While the forming impulses are applied between the collector and the emitter electrode in the circuit as shown in Fig. 1, equivalent results may be achieved by grounding the base electrode 13 and letting the emitter electrode 12 "float."

While there have been shown and described and pointed out the fundamental novel features of the invention as applied to a preferred embodiment, it will be understood that various omissions and substitutions and changes in the form and details of the method illustrated and in its performance may be made by those skilled in the art without departing from the spirit of the invention. It is the intention therefore, to be limited only as indicated by the scope of the following claims.

What is claimed:

1. The method of altering the electrical characteristics of a semiconductive circuit element having at least three contacts to a semiconductor body, at least one of said contacts being in restricted area contact with the semiconductor body, which comprises electrically forming said one restricted area contact to increase the current gain thereof to a desired value by passing direct current impulses in a reverse direction between said one restricted area contact and a selected one of either of the other contacts, and then electrically forming said same restricted area contact to increase the back resistance thereof to a desired value by passing direct current impulses in a reverse direcion between the restricted area contact and a selected one of either of the other contacts, each of said latter impulses being of a duration longer than any one of the impulses utilized to increase the current gain.

2. An electroforming method for a crystal triode which comprises passing direct current impulses in a reverse direction between the collector and emitter electrodes to increase the collector-emitter current amplification factor, and then passing direct current impulses in a reverse direction between the collector and emitter electrodes to increase the collector to base electrode reverse resistance, each of said latter impulses being of longer duration than any one of the impulses utilized to increase the current amplification factor.

3. The method of treating a transistor of the rectifying collector type and a main semiconductor body of resistivity of between 5 to 10 ohm centimeters and minority carrier lifetime greater than 50 microseconds, which comprises passing direct current impulse between the collector and the emitter electrode to increase the collector to emitter current amplification factor, the base electrode being left unconnected, and then passing direct current impulses between the collector and the emitter electrode to increase the collector reverse resistance, the base electrode being left unconnected, each of said latter impulses being of longer duration than any one of the impulses utilized to increase the current amplification factor.

4. The method of electrically forming a transistor of the rectifying collector type and a main semiconductor body portion of resistivity of between 5 to 10 ohm centimeters and minority carrier lifetime greater than 50 microseconds, which comprises passing direct current impulses between the collector and base electrode to increase the current amplification of the transistor, the emitter electrode being left unconnected, and then passing direct current impulses between the collector and base electrode to increase the collector reverse resistance, the emitter electrode being left unconnected, each of said latter impulses being of larger duration than any one of the impulses utilized to increase the current amplification.

5. The method of treating a transistor having three electrodes and a main semiconductor body portion of resistivity of between 5 to 10 ohm centimeters and minority lifetime greater than 50 microseconds, one of said electrodes being a rectifying collector, which comprises as a first step applying direct current impulses between said collector electrode and a selected one of either of the other electrodes to increase the collector current gain, and as a second step applying direct current impulses between said collector electrode and a selected one of either of the other electrodes to increase the back resistance of the collector electrode, each of the second step impulses being of a greater duration than any one of the first step impulses.

6. An electroforming process for a crystal triode employing an N-type germanium main body portion of a resistivity of between 5 to 10 ohm centimeters and minority carrier lifetime greater than 50 microseconds, and a collector electrode of which includes as an additive a donor type of impurity, said process comprising initially passing direct current impulses between the collector electrode and a selected one of either the base or emitter electrodes to establish the collector current gain at a desired value, and subsequently passing direct current impulses, each of duration longer than any one of said initial impulses, between the collector electrode and a selected one of either the base or emitter electrodes, to establish the collector back resistance at a desired value without appreciably altering said initially established collector current gain.

7. The method as in claim 6 further characterized in that said initial and subsequent direct current impulses have a selectably variable peak voltage of between 200 and 1000 volts.

8. The method as in claim 6 further characterized in that said impulses for establishing the collector back resistance are at least twice the duration of said impulses for establishing the collector current gain.

9. The method as in claim 6 further characterized in that said impulses for increasing the current gain are discharged from a capacitor having a capacitance in the range from .02 microfarad to .1 microfarad, said capacitor being initially charged to a potential between 200 to 1000 volts.

10. The method as in claim 9 further characterized in that said impulses to establish the collector back resistance are discharged from a capacitor having a capacitance in the range from .2 microfarad to 1.0 microfarad, said capacitor being initially charged to a potential between 200 to 1000 volts.

11. The method as in claim 10 further characterized in that a resistor having an impedance from 5 to 1000 ohms is connected in series with the capacitor discharge during the establishing of the current gain and the subsequent establishing of the collector back resistance.

References Cited in the file of this patent

UNITED STATES PATENTS

| | | |
|---|---|---|
| 2,653,374 | Matthews et al. | Sept. 29, 1953 |
| 2,775,536 | Dickinson | July 24, 1956 |